United States Patent
Chen et al.

(10) Patent No.: US 8,542,140 B2
(45) Date of Patent: Sep. 24, 2013

(54) EXPONENTIAL-LOGARITHMIC ANALOG-TO-DIGITAL CONVERTER

(75) Inventors: Hsin Chen, Hsinchu (TW); Hsin-Chi Chan, Hsinchu (TW); Yung-Chan Chen, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 13/347,666

(22) Filed: Jan. 10, 2012

(65) Prior Publication Data
US 2012/0176262 A1  Jul. 12, 2012

(30) Foreign Application Priority Data
Jan. 11, 2011   (TW) .............................. 100101021 A (51) Int. Cl.
*H03M 1/00*   (2006.01)
(52) U.S. Cl.
USPC ............................ 341/138; 341/155; 341/156
(58) Field of Classification Search
USPC .................. 341/138, 119, 155, 156
See application file for complete search history.

(56) References Cited

U.S. PATENT DOCUMENTS

| | | | | |
|---|---|---|---|---|
| 4,350,974 A | * | 9/1982 | Gordon et al. | 341/138 |
| 7,126,509 B2 | * | 10/2006 | Sit et al. | 341/119 |
| 7,482,844 B2 | * | 1/2009 | Brady et al. | 327/74 |
| 7,532,139 B2 | * | 5/2009 | Swain | 341/144 |
| 2005/0024245 A1 | * | 2/2005 | Sit et al. | 341/119 |

\* cited by examiner

*Primary Examiner* — Jean B Jeanglaude
(74) *Attorney, Agent, or Firm* — Chih Feng Yeh; Huntington IP Consulting Co., Ltd.

(57) ABSTRACT

An analog to digital converter by using an exponential-logarithmic model includes an exponential circuit which acquires an analog input voltage and generates an analog output voltage that is an exponential function of the input voltage. A positive feedback circuit that succeeds the exponential circuit exhibits a natural logarithmic characteristic. A comparator is connected to the positive feedback circuit to compare an output voltage of the positive feedback circuit with a reference voltage. Via the exponential-logarithmic conversion technique, the time interval or pulse produced by the positive feedback circuit is a linear function of the magnitude of the input voltage. Based on the comparator output, a counter is employed to translate the analog input signal to its digital representation.

10 Claims, 7 Drawing Sheets

EXPONENTIAL-LOGARITHMIC ANALOG-TO-DIGITAL CONVERTER

CROSS-REFERENCE TO RELATED APPLICATION

This present application claims priority to TAIWAN Patent Application Serial Number 100101021, filed on Jan. 11, 2011, which is herein incorporated by reference.

TECHNICAL FIELD

This invention relates to a new analog-to-digital converter architecture and more particularly to an analog-to-digital converter which employs an exponential-logarithmic model to convert a weak analog signal to a digital signal.

DESCRIPTION OF THE RELATED ART

Digital signal processing systems have been widely used in applications which include iPhones, cell phones, smart phones and other electronic devices. Analog-to-digital converters are essential elements in many digital signal processing systems which incorporate digital signal processors and analog-to-digital converters as analog-to-digital converters are utilized convert analog signals to digital signals which can be further processed by digital signal processors.

Some analog-to-digital conversion techniques are widely used. A dual-slope integrating ADC utilizes an integrator to convert an analog input voltage into a digital value. As the input voltage is applied to the input of the integrator to charge the integrator for a fixed interval of time, the charging time period is measured. Then a reference voltage of opposite polarity is applied to the integrator input to discharge the integrator, and the discharging time period is measured. The timing relationship for a dual-slope integrating ADC is defined by equation 1.

$$\frac{|V_{in}|}{|V_{ref}|} = \frac{T_{Charge}}{T_{Discharge}} \qquad (1)$$

Integrating ADCs are useful in applications that have low input bandwidths and operate at slow speeds.

A successive approximation ADC is also a popular analog-to-digital converter architecture. A successive approximation ADC employs a comparator to compare the input voltage with the output of a digital-to-analog converter and achieves analog-to-digital conversion through binary search. One of the main advantages of SAR converters is low power consumption.

Compared to the present invention, dual-slope integrating ADCs and SAR ADCs necessitate more capacitance to achieve the same resolution, thus increasing chip areas. The present invention provides a new analog-to-digital conversion technique that achieves analog-to-digital conversion and reduction of chip area by using an exponential-logarithmic model.

SUMMARY

To reduce the capacitances required by the prior arts and thus reduce chip areas, the present invention provides a new analog-to-digital converter architecture by using an exponential-logarithmic model to achieve analog-to-digital conversion. The present invention employs an exponential circuit and a logarithmic circuit which is a positive feedback circuit to achieve high-resolution analog-to-digital conversion.

The new analog-to-digital converter comprises an exponential circuit, a positive feedback circuit, a comparator, a logic control unit and a counter. An input voltage is applied to the input of the exponential circuit which produces a voltage that is an exponential function of the input voltage. The positive feedback circuit succeeds the output of the exponential circuit and generates a voltage that is a linear function of the input voltage. The comparator connected to the positive feedback circuit compares the rising output voltage of the positive feedback circuit with a reference voltage and changes its output state when the output voltage of the positive feedback circuit reaches the reference voltage. The counter measures the time interval or pulse produced by the comparator and generates a digital representation that corresponds to the input voltage.

BRIEF DESCRIPTION OF THE DRAWINGS

FIG. 1 illustrates a block diagram of the exponential-logarithmic ADC which the present invention relates to.

DETAILED DESCRIPTION

The invention is more fully appreciated in connection with the following detailed description taken in conjunction with the accompanying figures; however, those skilled in the art will appreciate that these examples are not intended to limit the scope of the present invention, and various changes and modifications are possible within the sprite and scope of the present invention.

Circumventing the difficulties imposed by the prior arts, the present invention relates to an exponential-logarithmic ADC implemented by an exponential-logarithmic model that converts an analog input voltage into a time-domain interval or pulse and a counter that translates the time interval into a digital output value. The exponential-logarithmic analog-to-digital converter of the present invention necessitates only 6 bits to realize a 1mV-LSB, therefore achieving an excellent resolution of the input signals.

Figure 1:
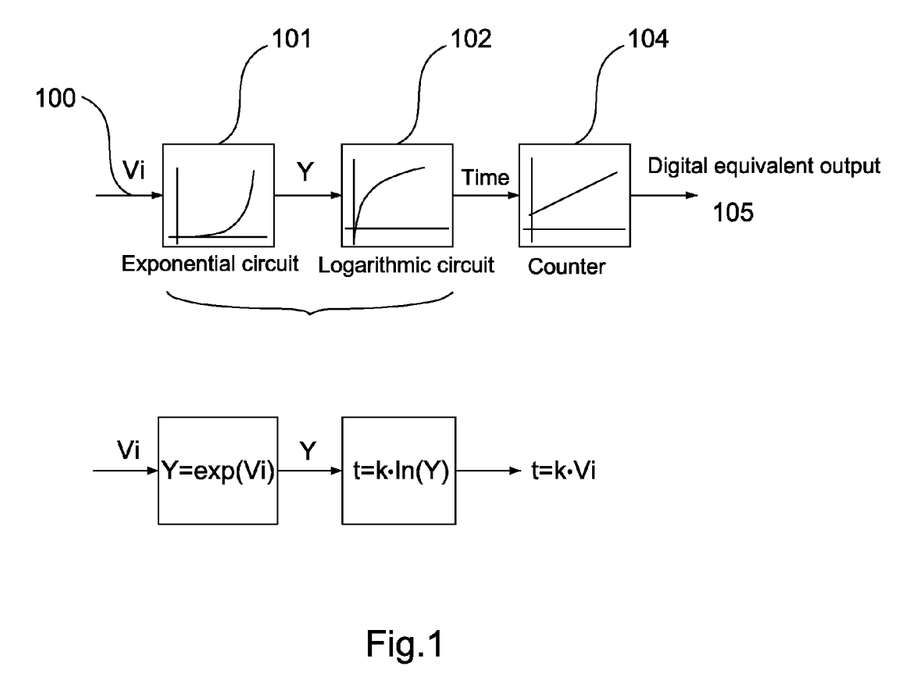

FIG. 1 illustrates a conceptual block diagram of the exponential-logarithmic analog-to-digital converter. As shown in FIG. 1, the analog-to-digital converter comprises an exponential circuit 101, a logarithmic circuit 102, and a counter 104. Initially, a sampled and held analog input voltage $V_i$ 100 is applied to the input of the exponential circuit 101. The exponential circuit 101 produces an analog output voltage Y which is an exponential function of the analog input voltage 100. The logarithmic circuit 102 that succeeds the exponential circuit 101 acquires the output voltage Y of the exponential circuit 101 and produces a time interval or pulse that exhibits a logarithmic characteristic. The exponential-logarithmic model comprising the exponential circuit 101 and the logarithmic circuit 102 produces a time interval which varies linearly with the input voltage. Time to digital conversion can thus be performed by the counter 104 to correlate the analog input voltage 100 with a digital output signal 105.

Figure 2:
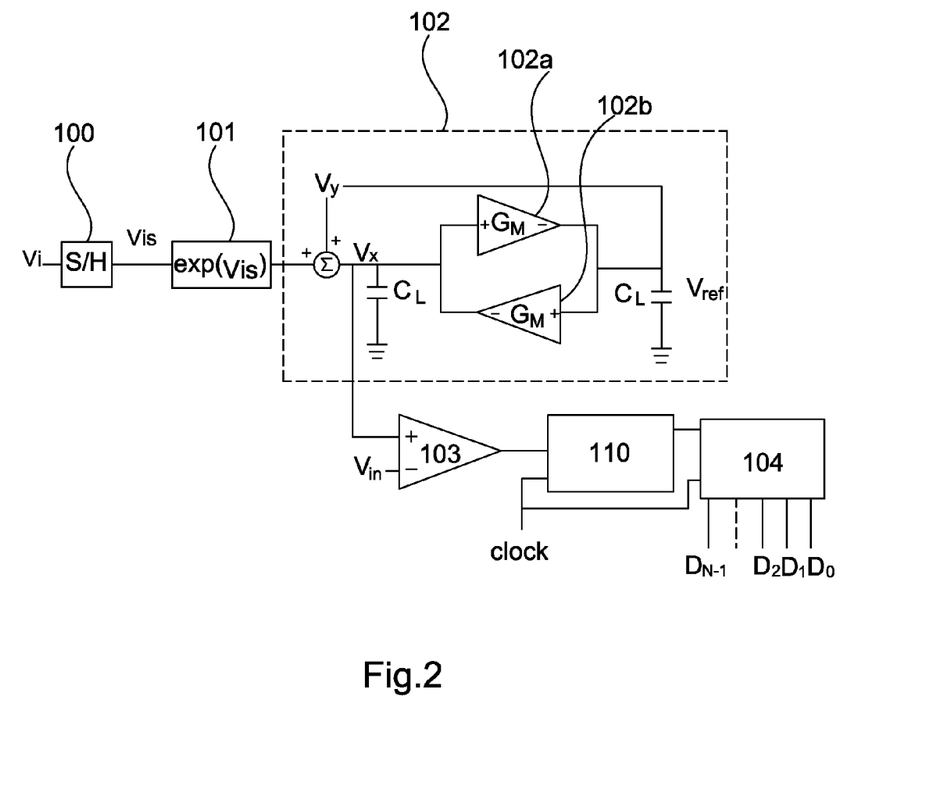
FIG. 2 illustrates an example of a functional block diagram of the exponential-logarithmic ADC.

FIG. 2 illustrates an example of a functional block diagram of the exponential-logarithmic ADC. As shown in FIG. 2, the exponential-logarithmic ADC of the present invention includes an exponential circuit 101, a positive feedback circuit 102, a comparator 103, a control logic circuit 110 and a counter 104. The positive feedback circuit 102 is connected to the exponential circuit 101 and the comparator 103, and the control logic circuit 110 is connected to the comparator 103 and the counter 104. In this case, the positive feedback circuit 102 is implemented by a latch shown in FIG. 3. Initially, an input voltage is sampled onto a sample and hold circuit. Next, the input voltage $V_{is}$ is applied to the input of the exponential circuit 101 which then produces an output voltage that is an exponential function of the input voltage 100. Subsequently, one terminal node of the positive feedback circuit 102 is initialized to a set point voltage, and the other terminal node of the positive feedback circuit 102 is initialized to the sum of the set point voltage and the output voltage of the exponential circuit. Based on the exponential characteristic of the exponential circuit 101 and the natural logarithmic characteristic exhibited by the positive feedback circuit 102, the integration of the exponential circuit 101 and the positive feedback circuit 102 shown in FIG. 2 allows the sense time of the positive feedback circuit 102 to vary linearly with the magnitude of the input voltage $V_{is}$. Consequently, time to digital conversion can be performed by the counter 104 to correlate the analog input signal with a digital output signal.

The positive feedback circuit 102 will force the voltage at the terminal node that received a greater initial voltage than the other terminal node to rise toward the positive supply voltage. Next, the comparator 103 compares this ascending voltage with a reference voltage. When the ascending voltage exceeds the reference voltage, the comparator 103 generates a signal which activates the control logic circuit 110 to latch the output ($D_1$, $D_2$, $D_3$ ... $D_{N-1}$) of the counter 104. The counter 104 determines the number of clock cycles necessary for the time interval between the initialization of the positive feedback circuit 102 and the instant the ascending output voltage of the positive feedback circuit 102 reaches a reference potential. The number of clock cycles corresponds to the analog input value; therefore, the output of the counter 104 represents the digital codeword of the input voltage $V_{is}$.

Figure 3:
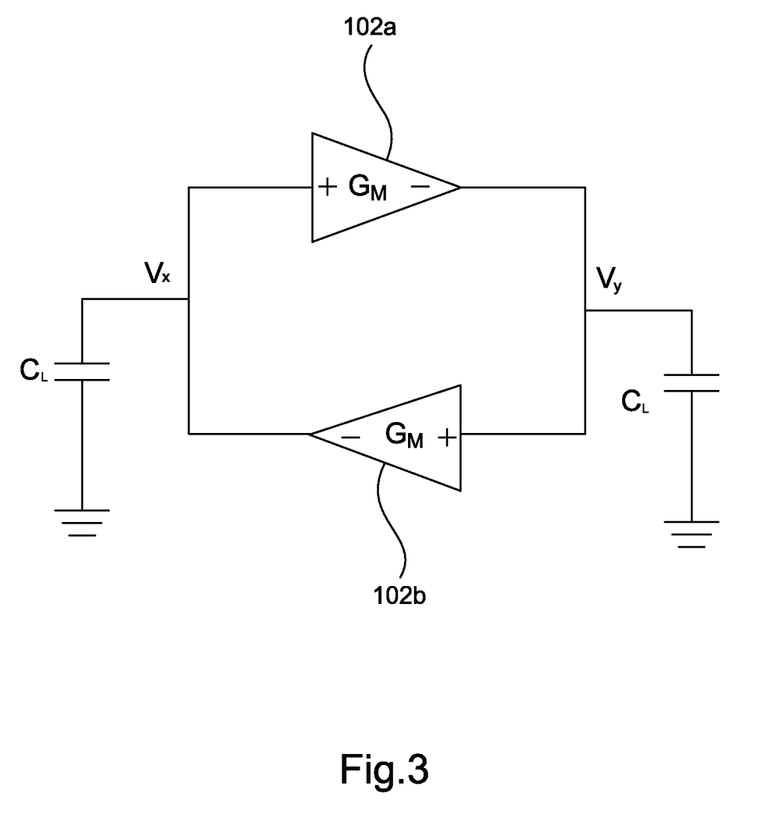
FIG. 3 illustrates an equivalent circuit of a positive feedback circuit according to the present invention.

FIG. 3 illustrates an equivalent circuit of a positive feedback circuit according to the present invention. FIG. 3 shows a positive feedback circuit 102 which comprises two inverting amplifiers 102a and 102b connected in a positive-feedback loop as a latch with a capacitor $C_L$ connected to each of the two terminal nodes of the inverting amplifiers 102a and 102b, respectively. The positive feedback circuit 102 amplifies the voltage between its two nodes and drives the voltages at the terminal nodes toward positive supply voltage ($V_{dd}$) and ground, respectively. The amplifiers in the regenerative circuit 102 drive capacitive loads and provide gain $G_M$. The changing voltage $V_x$ and $V_y$ across the capacitor $C_L$ can be expressed as $$\frac{dV_x}{dt} + \frac{G_M V_y}{C_L} = 0 \tag{2}$$

$$\frac{dV_y}{dt} + \frac{G_M V_x}{C_L} = 0 \tag{3}$$

The difference between the output of the regenerative circuit 102 can be written as $$V_{xy}(t) = \frac{C_L}{G_M} \cdot \frac{dV_{xy}(t)}{dt} \tag{4}$$

Under the assumption that $C_L$ and $G_M$ are constant and independent of voltage and time, integration of $G_M/G_L$ from 0 to t and integration of $1/V_{xy}$ from $V_{xy}(0)$ to $V_{xy}(t)$ are performed.

$$\int_{V_{xy}(0)}^{V_{xy}(t)} \frac{1}{V_{xy}(t)} dV_{xy} = \int_0^t \frac{G_M}{C_L} dt \tag{5}$$

The integrations yield $$V_{xy}(t) = V_{xy}(0) e^{t/\tau_{rc}} \tag{6}$$

where $\tau_{rc}$ is defined as $C_L/G_M$. The sense time which is time required for the $V_r$ nodes of the regenerative circuit 102 to achieve a certain potential, is a logarithm function of the voltage difference between the two nodes:

$$t_s = \tau_{rc} \ln\left[\frac{V_{xy}(t)}{V_{xy}(0)}\right] \tag{7}$$

and can be described as $$t_s = \tau_0 - \tau_{rc} \ln [V_x(0) - V_y(0)] \tag{8}$$

wherein $\tau_0$ is constant and defined as $\tau_{rc} \ln [V_{xy}(t)]$

Figure 4:
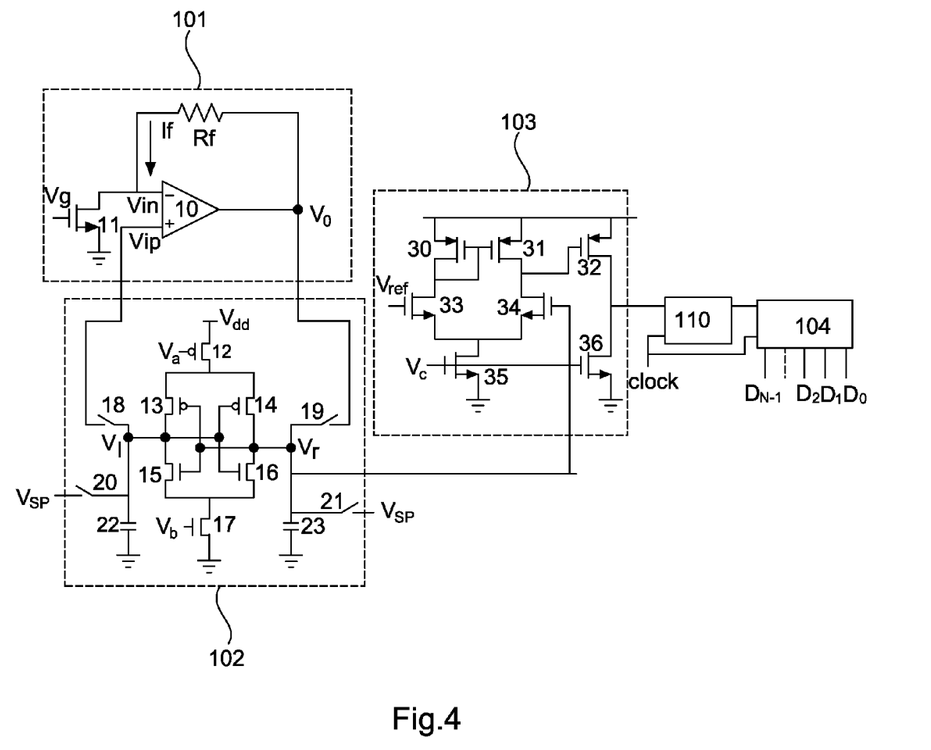
FIG. 4 illustrates an example of a circuit block diagram of the exponential-logarithmic ADC.

FIG. 4 illustrates an example of a functional block diagram of a positive feedback-based analog to digital converter according to the present invention. As shown in FIG. 4, the exponential-logarithmic analog to digital converter of the present invention comprises an exponential circuit 101, a positive feedback circuit 102, a comparator 103, a control logic circuit 110 and a digital counting circuit 104. Similarly, the positive feedback circuit 102 is connected to the exponential circuit 101 and the comparator 103, and the control logic circuit 110 is connected to the comparator 103 and the digital counting circuit 104. For example, the positive feedback circuit 102 is a sense amplifier with controlled switches 18, 19, 20 and 21, transistors 2, 13, 14, 15, 16, and 17 and two identical capacitors 22 and 23. Transistors 12, 13, 14 are PMOS transistors, and transistors 15, 16, 17 are NMOS transistors. The gate of PMOS transistor 13 is connected to gate of NMOS transistor 15, and drain of PMOS transistor 13 is connected to drain of NMOS transistor 15 to implement an inverter. Similarly, the other inverter is constructed by PMOS transistor 13 and NMOS transistor 15. Source of PMOS transistor 12 is connected to a reference voltage ($V_{dd}$), and gate of PMOS transistor 12 is connected to a gate voltage ($V_a$). Source of NMOS transistor 17 is connected to ground, and gate of NMOS transistor 17 is connected to a gate voltage ($V_b$). The sense amplifier is used to implement a logarithmic circuit and comprises two inverting amplifiers connected in a positive-feedback loop with a capacitor $C_L$ connected to each of the two terminal nodes of the sense amplifier, respectively, shown in FIG. 3. Capacitance of the capacitor $C_L$ can be adjusted depending on the actual or design requirement. Reset switches 20, 21 and Phi2 switches 18, 19 are controlled by non-overlapping clock waveforms, Reset and Phi2, respectively. The exponential circuit 101 comprises an operational amplifier 10, a resistor $R_f$ and an NMOS transistor 11 operating in the sub-threshold region. Resistor $R_f$ is connected between the negative input terminal ($V_{in}$) and output terminal ($V_o$) of the operational amplifier 10. Drain of NMOS transistor 11 is connected to the negative input terminal of the operational amplifier 10. Second input terminal ($V_{ip}$) and the output terminal ($V_o$) of the operational amplifier 10 is connected to switches 18 and 19 of the positive feedback circuit 102, respectively. The comparator 103 comprises transistors (30, 31, 32, 33, 34, 35, 36), wherein the transistors (30, 31, 32) are PMOS transistors, and transistors (34, 35, 36) are NMOS transistors. It should be noted that the gate of NMOS transistor 33 is connected to a reference voltage ($V_{ref}$), and the gate of NMOS transistor 34 is connected to the output terminal of the sense amplifier 102. The gate of PMOS transistor 30 is connected to drain of PMOS transistor 30. The gate of NMOS transistors 35 and 36 is connected to a gate voltage ($V_c$), and source of NMOS transistors 35 and 36 is connected to ground. The drain of PMOS transistor 32 is connected to drain of NMOS transistor 36. The drain of PMOS transistor 31 is connected to the drain of NMOS transistor 34.

Initially, both terminal nodes of the sense amplifier 102 are charged to the set point voltage, via the Reset signal, and equilibrium of the sense amplifier 102 is maintained. Next, as the reset switches 20, 21 turn off, voltages are applied to the two terminal nodes by turning on the Phi2 switches 18, 19. During the Phi2 phase period, the right terminal of the sense amplifier is initialized to a greater voltage $V_r(0)$ than the voltage at the left terminal $V_l(0)$. In this charging phase of the sense amplifier 102, the differential voltage between the two terminals of the sense amplifier 102 is latched. After the Phi2 switches open, the difference between the voltages $V_r(0)$ and $V_l(0)$ is amplified by the sense amplifier 102. Because $V_r$ is higher than $V_l$, the amplification inherent to the positive feedback of the sense amplifier 102 causes the voltage at the $V_r$ node to increase toward the positive supply voltage and the voltage at the $V_l$ node to decrease toward ground.

Figure 5:
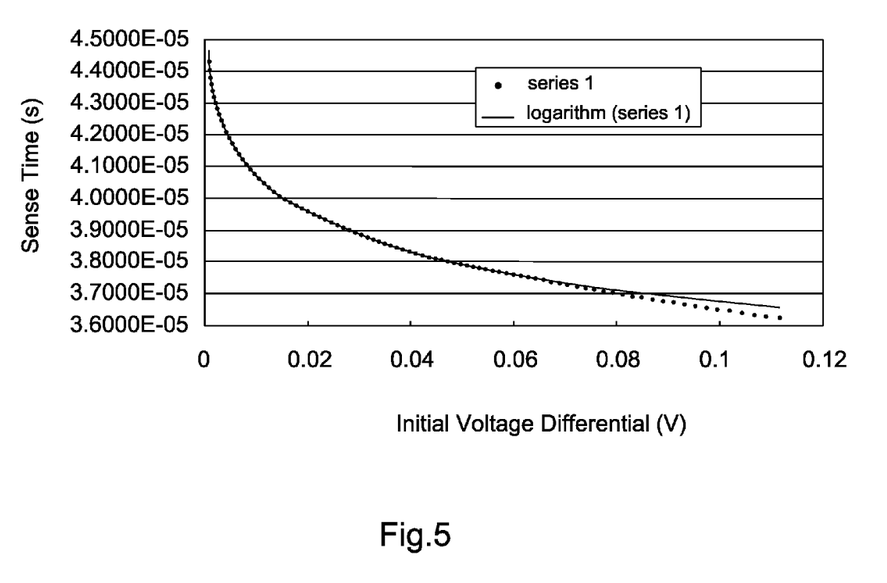
FIG. 5 shows the simulation result of the time required for the positive feedback circuit to produce a predetermined output voltage versus the initial voltage difference between the two terminals of the positive feedback circuit.

The time required for the sense amplifier 102 to reach a specified voltage separation is dependent on the initial voltage differential, the resistance and capacitance of the sense amplifier 102. The sense time can be expressed as $$t_s(V) = \tau_0 - \tau_{rc} \ln [V_r(0) - V_l(0)] \quad (9)$$

where $\tau_0$ is a constant and $\tau_{rc}$ is defined as $C_L/G_M$. As equation (9) indicates, the sense time of the sense amplifier 102 is a natural logarithmic function of the difference between the initial voltage at the left terminal node and the initial voltage at the right terminal node. FIG. 5 shows the simulation result of the time required for the positive feedback circuit to produce a predetermined output voltage versus the initial voltage difference between the two terminals of the positive feedback circuit. A logarithmic equation is fitted to the simulated data, which demonstrate a logarithmic characteristic.

In order for the sense time of the sense amplifier 102 to vary linearly as the amplitude of the input voltage, an NMOS transistor 11 operating in the sub-threshold region is configured as the input to an operational amplifier 10 with the output $V_o$ of the operational amplifier 10 connected to $V_r$ and the non-inverting input $V_{ip}$ of the operational amplifier connected to $V_l$. This configuration replaces the difference between $V_r(0)$ and $V_l(0)$ in equation (9) with an exponential function. The sub-threshold NMOS transistor 11 produces a drain-source current that is an exponential function of the gate-source voltage and can be expressed as $$I = I_0 e^{\left(\frac{V_{gs}}{\eta V_T}\right)} \quad (10)$$

where $V_T = kT/q$ is the thermal voltage, $\eta$ is nonlinear parameter, $I_0$ is process parameter associated with transistor area, and $V_{gs}$ is gate-source voltage, which is the input voltage of the analog-to-digital converter, and $I_0$ is the zero-bias current.

During the charging phase of the sense amplifier 102, the current supplied by the sub-threshold NMOS transistor 11 flows through the feedback resistor $R_f$ and is converted to a voltage expressed as $IR_f$. The output voltage of the operating amplifier 10 can thus be described as $V_{out} = IR_f + V_{ip}$. Therefore, the right node ($V_r$) of the sense amplifier 102 is charged to the output voltage ($V_{out} = IR_f + V_{ip}$) of the operational amplifier 10; the left node ($V_l$) of the sense amplifier 102 is charged to the voltage ($V_{ip}$) at the positive terminal of the operational amplifier 10. The initial voltage differential of the positive feedback amplifier can be expressed as $$V_r(0) - V_l(0) = (IR_f + V_{ip}) - V_{ip} = IR_f = I_0 R_F e^{\left(\frac{V_{gs}}{\eta V_T}\right)} \quad (11)$$

The sense time of the sense amplifier 102 can thus be obtained by combining equations 10 and 11

$$t_S(V) = \tau_0 - \tau_{rc} \ln(I_0 R_F) - \tau_{rc}\left(\frac{V_g}{\eta V_T}\right) \quad (12)$$

Figure 6:
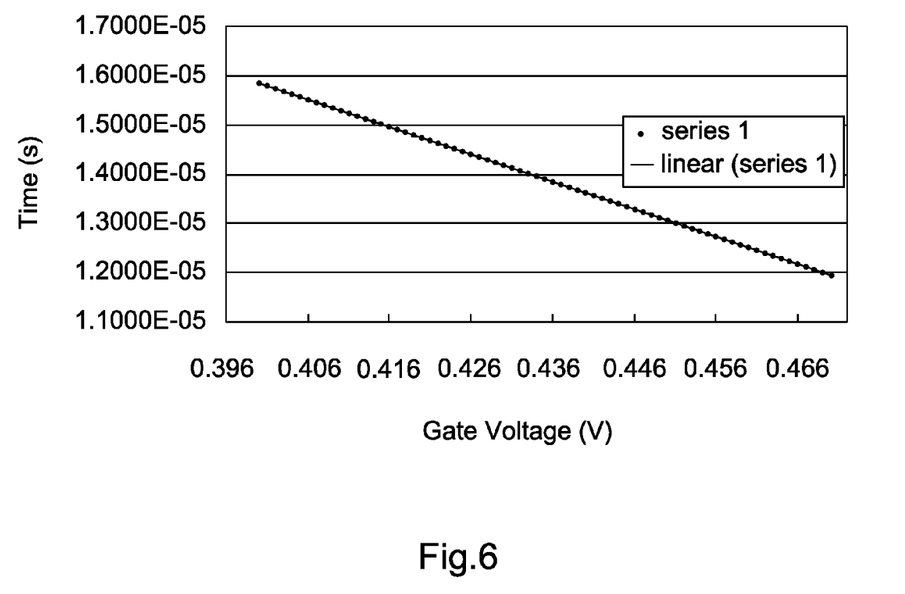
FIG. 6 is the simulation result of the plot of the time interval produced by the comparator versus the input voltage.

Via this exponential-logarithmic conversion technique, the produced time interval is a linear function of the input voltage $V_g$ as shown in equation (12) and as illustrated in the simulation result in FIG. 6 where the X axis indicates the input voltage which is applied to the input of the exponential circuit 101, and the Y axis indicates the time required for the voltage Vr at the right node of the positive feedback circuit 102 to rise to a specified voltage.

Subsequently, the reference voltage, $V_{ref}$, is applied to the negative terminal of the comparator 103, and the signal $V_r$ which is rising toward the positive rail, is applied to the positive terminal of the comparator 103. The output of the comparator 103 is sent to the control logic circuit 110. As the rising signal $V_r$ exceeds $V_{ref}$, the output of the comparator 103 changes state to disable the counter 104, and the digital codeword corresponding to the analog signal is latched. After the digital codeword is read out, the counter 104 is reset by using digital circuitry.

Figure 7:
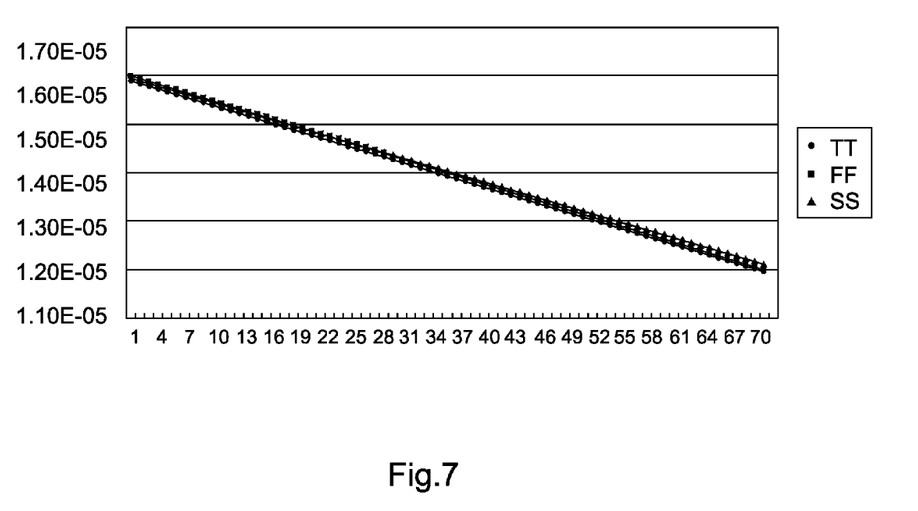
FIG. 7 shows the simulation results in different process corners and indicates the linear relationship between the time intervals and the input voltages.

FIG. 7 shows the simulation results in different process corners and indicates the linear relationships between the time intervals and the input voltages.

TABLE 1

| Input Voltage (V) | Output Digital Code |
|---|---|
| 0.401 | 000000 |
| 0.402 | 000001 |
| 0.403 | 000010 |
| 0.404 | 000011 |
| 0.405 | 000100 |
| 0.406 | 000101 |
| 0.407 | 000110 |

TABLE 1-continued

| Input Voltage (V) | Output Digital Code |
| --- | --- |
| 0.408 | 000111 |
| 0.409 | 001000 |
| 0.41 | 001001 |
| 0.411 | 001010 |
| 0.412 | 001011 |
| 0.413 | 001100 |
| 0.414 | 001101 |
| 0.415 | 001110 |
| 0.416 | 001111 |
| 0.417 | 010000 |
| 0.418 | 010001 |
| 0.419 | 010010 |
| 0.42 | 010011 |
| 0.421 | 010100 |
| 0.422 | 010101 |
| 0.423 | 010110 |
| 0.424 | 010111 |
| 0.425 | 011000 |
| 0.426 | 011001 |
| 0.427 | 011010 |
| 0.428 | 011011 |
| 0.429 | 011100 |
| 0.43 | 011101 |
| 0.431 | 011110 |
| 0.432 | 011111 |
| 0.433 | 100000 |
| 0.434 | 100001 |
| 0.435 | 100010 |
| 0.436 | 100011 |
| 0.437 | 100100 |
| 0.438 | 100101 |
| 0.439 | 100110 |
| 0.44 | 100111 |
| 0.441 | 101000 |
| 0.442 | 101001 |
| 0.443 | 101010 |
| 0.444 | 101011 |
| 0.445 | 101100 |
| 0.446 | 101101 |
| 0.447 | 101110 |
| 0.448 | 101111 |
| 0.449 | 110000 |
| 0.45 | 110001 |
| 0.451 | 110010 |
| 0.452 | 110011 |
| 0.453 | 110100 |
| 0.454 | 110101 |
| 0.455 | 110110 |
| 0.456 | 110111 |
| 0.457 | 111000 |
| 0.458 | 111001 |
| 0.459 | 111010 |
| 0.46 | 111011 |
| 0.461 | 111100 |
| 0.462 | 111101 |
| 0.463 | 111110 |
| 0.464 | 111111 |
| — | — |
| — | — |

Table 1 indicates the 6-bit digital output codes corresponding to the input voltages in the TT process corner. The present invention merely requires 6 bits to resolve an LSB of 1 mV. The present invention can be used for neural recording since neural signals are weak and have low frequencies, and small chip areas can facilitate multi-site neural recording.

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. An analog to digital converter by an exponential-logarithmic conversion, comprising:
   an exponential circuit which acquires an analog input voltage and produces an analog output voltage that is an exponential function of the input voltage;
   a positive feedback circuit connected to the aforementioned exponential circuit;
   a comparator connected to the aforementioned positive feedback circuit to compare the output voltage of the positive feedback circuit with a reference voltage; and
   a counter connected to the comparator to determine the ADC output represented by a time interval or pulse.

2. The analog to digital converter of claim 1, further comprising a logic circuit connected to the said comparator to latch the output of said counter.

3. The analog to digital converter of claim 1, wherein the aforementioned exponential circuit comprises an operational amplifier, a resistor and an NMOS transistor operating in the subthreshold region, wherein the resistor is connected between the inverting input terminal and output terminal of the aforementioned operational amplifier and the drain of the NMOS transistor is connected to the inverting input terminal of the aforementioned operational amplifier.

4. The analog to digital converter of claim 3, wherein the aforementioned positive feedback circuit comprises a plurality of controlled switches, transistors and two identical capacitors.

5. The analog to digital converter of claim 4, wherein the positive input terminal and the output terminal of the aforementioned operational amplifier are connected to the terminals of the aforementioned positive feedback circuit, respectively by the aforementioned control switches.

6. The analog to digital converter of claim 1, wherein the said positive feedback circuit comprises two inverting amplifiers connected to two identical capacitors.

7. The analog to digital converter of claim 1, wherein the said comparator comprises a plurality of transistors.

8. The analog to digital converter of claim 7, wherein the gate of a first transistor of the plurality of transistors is connected to the said output terminal of the said positive feedback circuit, and the gate of a second transistor of the said plurality of transistors is connected to said reference voltage.

9. The analog to digital converter of claim 1, wherein the said positive feedback circuit is a sense amplifier.

10. The analog to digital converter of claim 1, wherein the said positive feedback circuit is a regenerative circuit.

* * * * *